(12) United States Patent
Ryabko et al.

(10) Patent No.: US 12,308,612 B2
(45) Date of Patent: May 20, 2025

(54) VISIBLE LIGHT-EMITTING SEMICONDUCTOR LASER DEVICE AND METHOD OF MANUFACTURING THE SAME

(71) Applicant: SAMSUNG ELECTRONICS CO., LTD., Suwon-si (KR)

(72) Inventors: Maxim Vladimirovich Ryabko, Moscow (RU); Alexey Andreevich Shchekin, Moscow (RU); Aleksandr Sergeevich Shorokhov, Moscow (RU)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 547 days.

(21) Appl. No.: 17/824,526

(22) Filed: May 25, 2022

(65) Prior Publication Data

US 2022/0393434 A1 Dec. 8, 2022

(30) Foreign Application Priority Data

Jun. 2, 2021 (RU) .......................... RU2021115883
Feb. 17, 2022 (KR) ........................ 10-2022-0021037

(51) Int. Cl.
*H01S 5/183* (2006.01)
*H01S 5/026* (2006.01)
(Continued)

(52) U.S. Cl.
CPC .......... *H01S 5/18302* (2013.01); *H01S 5/026* (2013.01); *H01S 5/1042* (2013.01); *H01S 5/18361* (2013.01); *H01S 5/343* (2013.01)

(58) Field of Classification Search
CPC .......................................... H01S 5/183–18397
See application file for complete search history.

(56) References Cited

U.S. PATENT DOCUMENTS

| 8,711,357 B2 | 4/2014 | Liu et al. |
| 9,360,415 B2 | 6/2016 | Liu et al. |

(Continued)

FOREIGN PATENT DOCUMENTS

| CN | 104769481 A | 7/2015 |
| KR | 1020120007160 A | 1/2012 |

(Continued)

OTHER PUBLICATIONS

Camacho-Morales et al. Nonlinear Generation of Vector Beams From AlGaAs Nanoantennas Nano Letters 2016 16 (11), 7191-7197 (Year: 2016).*

(Continued)

*Primary Examiner* — Minsun O Harvey
*Assistant Examiner* — Stephen Sutton Kotter
(74) *Attorney, Agent, or Firm* — Sughrue Mion, PLLC

(57) ABSTRACT

A semiconductor laser light-emitting structure includes a semiconductor laser light-emitting structure having a vertical-cavity surface-emitting laser structure and configured to emit light having a first wavelength, and a wavelength converter including a metasurface and monolithically formed with the semiconductor laser light-emitting structure on a light output side of the semiconductor laser light-emitting structure, wherein the metasurface is configured to non-linearly convert the light having the first wavelength into light having a second wavelength.

18 Claims, 21 Drawing Sheets

(51) Int. Cl.
*H01S 5/10* (2021.01)
*H01S 5/343* (2006.01)

(56) References Cited

U.S. PATENT DOCUMENTS

| | | |
|---|---|---|
| 9,740,003 B2 | 8/2017 | Potsaid et al. |
| 10,777,970 B2 | 9/2020 | Han et al. |
| 2002/0145042 A1 | 10/2002 | Knowle et al. |
| 2003/0019931 A1 | 1/2003 | Tsikos et al. |
| 2003/0019932 A1 | 1/2003 | Tsikos et al. |
| 2003/0019933 A1 | 1/2003 | Tsikos et al. |
| 2003/0034387 A1 | 2/2003 | Knowles et al. |
| 2003/0034395 A1 | 2/2003 | Tsikos et al. |
| 2003/0034396 A1 | 2/2003 | Tsikos et al. |
| 2003/0035460 A1 | 2/2003 | Tsikos et al. |
| 2003/0035461 A1 | 2/2003 | Tsikos et al. |
| 2003/0042303 A1 | 3/2003 | Tsikos et al. |
| 2003/0042304 A1 | 3/2003 | Knowles et al. |
| 2003/0042309 A1 | 3/2003 | Tsikos et al. |
| 2003/0042314 A1 | 3/2003 | Tsikos et al. |
| 2003/0042315 A1 | 3/2003 | Tsikos et al. |
| 2003/0047597 A1 | 3/2003 | Knowles et al. |
| 2003/0052175 A1 | 3/2003 | Tsikos et al. |
| 2003/0053513 A1 | 3/2003 | Pirooz, V et al. |
| 2003/0062414 A1 | 4/2003 | Tsikos et al. |
| 2003/0062415 A1 | 4/2003 | Tsikos et al. |
| 2003/0071119 A1 | 4/2003 | Tsikos et al. |
| 2003/0071122 A1 | 4/2003 | Tsikos et al. |
| 2003/0071123 A1 | 4/2003 | Tsikos et al. |
| 2003/0071124 A1 | 4/2003 | Constantine et al. |
| 2003/0071128 A1 | 4/2003 | Tsikos et al. |
| 2003/0080190 A1 | 5/2003 | Constantine et al. |
| 2003/0080192 A1 | 5/2003 | Tsikos et al. |
| 2003/0085280 A1 | 5/2003 | Tsikos et al. |
| 2003/0085281 A1 | 5/2003 | Knowles et al. |
| 2003/0089778 A1 | 5/2003 | Tsikos et al. |
| 2003/0094495 A1 | 5/2003 | Knowles et al. |
| 2003/0098349 A1 | 5/2003 | Tsikos et al. |
| 2003/0098353 A1 | 5/2003 | Tsikos et al. |
| 2003/0102379 A1 | 6/2003 | Tsikos et al. |
| 2003/0218070 A1 | 11/2003 | Tsikos et al. |
| 2006/0023757 A1 | 2/2006 | Mooradian et al. |
| 2006/0029120 A1 | 2/2006 | Mooradian et al. |
| 2006/0086794 A1 | 4/2006 | Knowles et al. |
| 2020/0073029 A1* | 3/2020 | Han .................. G02B 5/3058 |
| 2020/0119521 A1 | 4/2020 | Feng et al. |
| 2020/0319316 A1* | 10/2020 | Jang .................. G01S 7/4814 |

FOREIGN PATENT DOCUMENTS

| | | |
|---|---|---|
| KR | 1020200067748 A | 6/2020 |
| RU | 2611555 C1 | 2/2017 |
| RU | 197331 U1 | 4/2020 |
| WO | 0243195 A2 | 5/2002 |
| WO | 2012054886 A1 | 4/2012 |
| WO | 2014059331 A1 | 4/2014 |
| WO | 2015167961 A1 | 11/2015 |
| WO | 2019046827 A1 | 3/2019 |
| WO | 2020163561 A1 | 8/2020 |

OTHER PUBLICATIONS

Liu et al. Resonantly Enhanced Second-Harmonic Generation Using III-V Semiconductor All-Dielectric Metasurface, Nano Letters 2016 16 (9), 5426-5432 (Year: 2016).*

Liu, S., et al., "III-V Semiconductor Nanoresonators—A New Strategy for Passive, Active, and Nonlinear All-Dielectric Metamaterials", Advanced Optical Materials, Jun. 10, 2016, pp. 1-5.

Liu, Z., et al., "High-Q Quasibound States in the Continuum for Nonlinear Metasurfaces", Physical Review Letters, vol. 123, Dec. 17, 2019, pp. 253901-1-253901-6.

Zubyuk, V., et al., "Low-Power Absorption Saturation in Semiconductor Metasurfaces", ACS Photonics, Oct. 4, 2019, pp. A-J (10 pages).

Rao, Y., et al., "Long-Wavelength VCSEL Using High-Contrast Grating", IEEE Journal of Selected Topics in Quantum Electronics, vol. 19, No. 4, Jul./Aug. 2013, 11 pages.

Vabishchevich, P., et al., "Enhanced Second-Harmonic Generation Using Broken Symmetry III-V Semiconductor Fano Metasurfaces", ACS Photonics, Jan. 27, 2018, pp. A-F (6 pages).

Huang, M., et al., "A surface-emitting laser incorporating a high-index-contrast subwavelength grating", Nature Publishing Group, vol. 1, Feb. 2007, pp. 119-122 (5 pages).

Communication dated Nov. 11, 2021 issued by the Federal Institute of Industrial Property of the Federal Service on Industrial Property, Patent and Trade Marks, in Russian Patent Application No. 2021115883.

* cited by examiner

VISIBLE LIGHT-EMITTING SEMICONDUCTOR LASER DEVICE AND METHOD OF MANUFACTURING THE SAME

CROSS-REFERENCE TO RELATED APPLICATIONS

This application is based on and claims priority to Russian Patent Application No. 2021115883, filed on Jun. 2, 2021, in the Federal Service for Intellectual Property, and Korean Patent Application No. 10-2022-0021037, filed on Feb. 17, 2022, in the Korean Intellectual Property Office, the disclosures of which are incorporated by reference herein in their entireties.

BACKGROUND

1. Field

The present disclosure relates to a visible light-emitting semiconductor laser device and a method of manufacturing the same.

2. Description of the Related Art

Semiconductor lasers emitting light having different wavelengths are widely used in various technical fields. Because a material of an active area varies with a wavelength of an emitted laser, active areas of semiconductor lasers emitting different wavelengths include different materials, for example, semiconductor materials. Accordingly, semiconductor lasers emitting light having different wavelengths have different parameters, for example, stability, emission power, lifespan, or the like. For example, infrared semiconductor lasers are stable, powerful, and have a long lifespan. On the other hand, a semiconductor laser emitting light in a green area having a wavelength range of about 480 nm to about 600 nm is unstable, not powerful, and has a short lifespan because nitride is used as a material of an active area. For example, active areas based on nitride such as InGaN and GaN may include many defects that occur during the growth of an active area layer. The defects capture carriers and reduce the recombination efficiency of electrons and holes in an active area. Accordingly, a threshold for current breakdown of a light-emitting structure is greatly reduced, which makes it difficult to obtain a high carrier concentration in the active area, and also photon emission is reduced. As a result, a laser operation is unstable. In addition, current pumping in a semiconductor laser having a nitride-based active area may result in a significant reduction in the lifespan of the semiconductor laser.

A device including a quantum dot-based vertical-cavity surface-emitting laser (VCSEL) that emits visible light and a converter that converts laser emission into visible light having a desired wavelength may be used. The quantum dot-based VCSEL has an active area having quantum dots that enhance an emission power. However, the quantum dot-based VCSEL having a nitride-based active area has lower emission power than an infrared VCSEL.

SUMMARY

One or more example embodiments provide a visible light-emitting semiconductor laser device having operational stability.

One or more example embodiments provide a visible light-emitting semiconductor laser device having a high emission power.

One or more example embodiments provide a visible light-emitting semiconductor laser device having a long lifespan.

One or more example embodiments provide a visible light-emitting semiconductor laser device that is compact and may be manufactured in a single chip.

One or more example embodiments provide a visible light-emitting semiconductor laser device in which a plurality of structures emitting light having different wavelengths may be easily manufactured on a single wafer.

Additional aspects will be set forth in part in the description which follows and, in part, will be apparent from the description, or may be learned by practice of embodiments of the disclosure.

According to an aspect of an example embodiment, there is provided a semiconductor laser device including: a semiconductor laser light-emitting structure having a vertical-cavity surface-emitting laser structure, the semiconductor laser light-emitting structure being configured to emit light having a first wavelength; and a wavelength converter including a metasurface, the wavelength converter being monolithically formed with the semiconductor laser light-emitting structure on a light output side of the semiconductor laser light-emitting structure, wherein the metasurface is configured to non-linearly convert the light having the first wavelength into light having a second wavelength.

The semiconductor laser light-emitting structure may be further configured to emit infrared light, and the wavelength converter may be further configured to non-linearly convert the infrared light into visible light.

Each of the semiconductor laser light-emitting structure and the metasurface may include a Group III-V semiconductor compound.

The metasurface may include a plurality of nanoresonators, and each of the plurality of nanoresonators has an asymmetric cross-sectional shape.

Each of the plurality of nanoresonators may include a spacer layer and a semiconductor compound layer may be provided on the spacer layer.

The semiconductor compound layer of each of the plurality of nanoresonators may include an AIIIBV semiconductor compound.

The spacer layer of each of the plurality of nanoresonators may include an oxide of a Group III-V semiconductor compound.

The metasurface may include a spacer layer provided below the plurality of nanoresonators.

The semiconductor laser light-emitting structure may include an active area layer and a lower distributed Bragg reflector layer provided on one side of the active area layer, and the metasurface is provided on an opposite side of the lower distributed Bragg reflector layer with respect to the active area layer.

The metasurface may be configured to function as an upper reflector layer pairing up with the lower distributed Bragg reflector layer.

The semiconductor laser device may further include a transparent dielectric layer covering the metasurface; and an upper distributed Bragg reflector layer provided on the transparent dielectric layer.

The semiconductor laser device may further include an air gap between the metasurface and the semiconductor laser light-emitting structure.

The semiconductor laser device may further include a plurality of sub-semiconductor laser devices in each of which the semiconductor laser light-emitting structure and the wavelength converter are integrated, and each of the plurality of sub-semiconductor laser devices may be configured to emit visible light having a wavelength different from other sub-semiconductor laser devices of the plurality of sub-semiconductor laser devices.

According to an aspect of an example embodiment, there is provided a semiconductor laser device including: a substrate; a semiconductor laser light-emitting structure including: a lower distributed Bragg reflector layer, a first-type conductive semiconductor contact layer, an active area layer, and a second-type conductive semiconductor contact layer, which are sequentially stacked on the substrate, wherein the semiconductor laser light-emitting structure includes a vertical-cavity surface-emitting laser structure configured to emit infrared light; and a metasurface including a plurality of nanoresonators, each of the plurality of nanoresonators having an asymmetric cross-sectional shape, the metasurface being provided on the second-type conductive semiconductor contact layer and configured to non-linearly convert the infrared light into visible light, wherein each of the semiconductor laser light-emitting structure and the metasurface includes a Group III-V semiconductor compound, and wherein the metasurface is monolithically integrated with the semiconductor laser light-emitting structure.

Each of the plurality of nanoresonators may include a spacer layer and a semiconductor compound layer provided on the spacer layer.

The semiconductor compound layer of each of the plurality of nanoresonators may include an AIIIBV semiconductor compound, and the spacer layer of each of the plurality of nanoresonators may include an oxide of the Group III-V semiconductor compound.

The metasurface may include a spacer layer provided below the plurality of nanoresonators.

The metasurface may be configured to function as an upper reflector layer pairing up with the lower distributed Bragg reflector layer.

The semiconductor laser device may further include a transparent dielectric layer covering the metasurface; and an upper distributed Bragg reflector layer provided on the transparent dielectric layer.

An air gap may exist between the metasurface and the semiconductor laser light-emitting structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
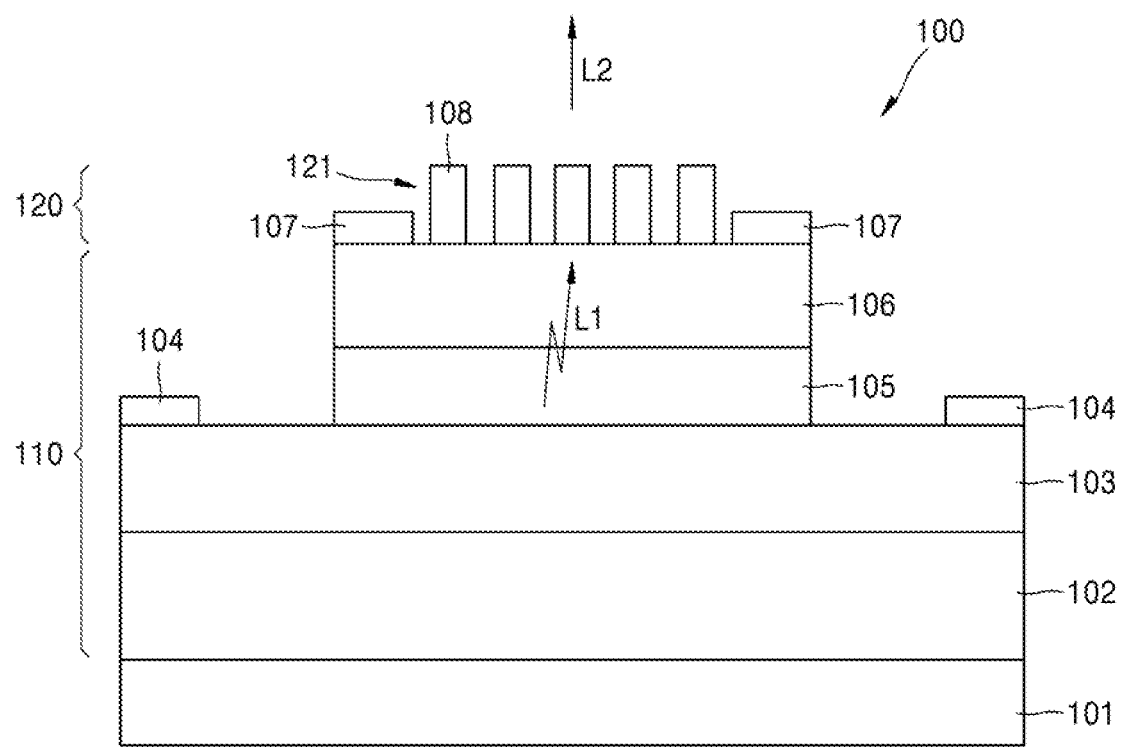
FIG. 1 shows a visible light-emitting semiconductor laser device according to an example embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The following description with reference to the drawings is provided to help a thorough understanding of various embodiments of the disclosure defined by the claims and equivalents thereof. The description includes various specific details to aid such understanding, but these details are to be regarded as illustrative only. Accordingly, numerous changes and modifications of various embodiments will be readily apparent to one of ordinary skill in the art without departing from the scope of the disclosure. In addition, descriptions of well-known functions and structures may be omitted for clarity and brevity.

The terms and forms used in the following description and claims are not limited to the bibliographical meaning, but are used in the present disclosure only to provide a clear and consistent understanding of the present disclosure. Accordingly, it is clear to one of ordinary skill in the art that the following description of various embodiments of the disclosure is merely an example.

An expression used in the singular encompasses the expression of the plural, unless it has a clearly different meaning in the context. In addition, it is to be understood that the terms such as "including," "having," and "comprising" are intended to indicate the existence of the features, values, operations, components and/or formations disclosed when the terms are used in the present disclosure, and are not intended to preclude the possibility that one or more other features, values, operations, formations, and/or groups thereof may exist or may be added. Hereinafter, various embodiments of the present disclosure will be described in detail with reference to the drawings.

A Novalux extended cavity surface emitting laser (NECSEL) includes a vertical-cavity surface-emitting laser (VCSEL) that emits light and a converter that converts infrared light into green light. The converter has a layer of periodically poled lithium niobate and a volume Bragg grating layer. The converter is robust and has a long lifespan. However, the converter may be difficult to use in a mobile device due to a large size thereof. In addition, because a material different from a material used for manufacturing the VCSEL is used for manufacturing the converter, the VCSEL and the converter may not be manufactured in a monolithic manufacturing operation and in a single chip. Accordingly, an assembly operation of the VCSEL and the converter is required as a subsequent operation.

As a converter, a plan of applying a complex structure having a mode-locked modulator, a non-linear optical material, and a frequency selective time delay element may be suggested. However, even with this plan, the size of the converter may be difficult to be used in a mobile device. In addition, because the converter and the VCSEL may not be manufactured in a monolithic manufacturing operation, an additional assembly of the VCSEL and the converter may be required. Also, it may be difficult to manufacture, on a single wafer, a device having a converter and a VCSEL, which are integrated, and emitting light having different wavelengths.

A converter converting infrared light into visible light by using a non-linear optical material is considered. However, in such a plan also, because the non-linear optical material is not a material used for manufacturing a VCSEL, the converter and the VCSEL may not be manufactured in a monolithic manufacturing operation and in a single chip, and thus, an additional assembly of the VCSEL and the converter may be required. Also, it may be difficult to manufacture, on a single wafer, a device having a converter and a VCSEL, which are integrated, and emitting light having different wavelengths.

Operational stability, high emission power, and long lifespan may be implemented by using a semiconductor laser emitting structure emitting infrared light, for example, a VCSEL emitting infrared light. The compactness, device implementation on a single chip, ease of manufacturing a single device, and ease of manufacturing a plurality of devices emitting light having different wavelengths on a single wafer may be implemented by manufacturing a semiconductor laser light-emitting structure and a wavelength converter in a monolithic manufacturing operation by using operations and materials used for manufacturing the semiconductor laser light-emitting structure. The compactness of a device may be implemented by using, as a wavelength converter, a metasurface having an array of nanoresonators of which the height thereof does not exceed a wavelength of light emitted by the semiconductor laser light-emitting structure, for example, infrared light.

FIG. 1 schematically shows a visible light-emitting semiconductor laser device 100 according to an example embodiment. Referring to FIG. 1, an embodiment of the visible light-emitting semiconductor laser device 100 may include a substrate 101, a semiconductor laser light-emitting structure 110 emitting light L1 having a first wavelength, and a wavelength converter 120 arranged on a light output side of the semiconductor laser light-emitting structure 110 and non-linearly converting the light L1 having the first wavelength into light L2 having a second wavelength. The semiconductor laser light-emitting structure 110 may be a VCSEL. The wavelength converter 120 may include a metasurface 121. The metasurface 121 non-linearly converts the light L1 having the first wavelength into the light L2 having the second wavelength. The metasurface 121 may have a second harmonic generation structure. For example, the metasurface 121 may include an array of nanoresonators 108 (e.g., a plurality of nanoresonators) as an example of the second harmonic generation structure. Each of nanoresonators 108 has a form factor smaller than an operating wavelength. For example, at least one of parameters defining the form factor of the nanoresonator 108 is less than the operating wavelength. The metasurface 121 includes the same type of material as a material forming the semiconductor laser light-emitting structure 110. Thereby, the wavelength converter 120 may be monolithically formed with the semiconductor laser light-emitting structure 110 by using operations and materials for manufacturing the semiconductor laser light-emitting structure 110. The light L1 may be infrared light, and the metasurface 121 may non-linearly convert the light L1 into the light L2 of a visible wavelength band. The semiconductor laser light-emitting structure 110 emitting infrared light is generally stable, powerful, and has a long lifespan. The monolithic integration of the semiconductor laser light-emitting structure 110 and the wavelength converter 120 non-linearly converting infrared light into visible light may provide the visible light-emitting semiconductor laser device 100 which is stable, powerful, and has a long lifespan.

As an example embodiment, the semiconductor laser light-emitting structure 110 may include a lower distributed Bragg reflector layer 102 on the substrate 101, a first-type conductive semiconductor contact layer 103 on the lower distributed Bragg reflector layer 102, an active area layer 105, and a second-type conductive semiconductor contact layer 106. The semiconductor laser light-emitting structure 110 may include a Group III-V compound semiconductor material. For example, the semiconductor laser light-emitting structure 110 may include a GaAs-based compound semiconductor material. For example, the semiconductor laser light-emitting structure 110 may include at least one of GaInP, AlGaInP, GaAs, GaInAs, AlGaAs, and AlGaInAs.

As an example embodiment, the substrate 101 may be a semiconductor substrate. For example, a Si substrate, a GaAs substrate, or the like may be used as the substrate 101. When necessary, a buffer layer and a seed layer for lattice matching between a material forming the semiconductor laser light-emitting structure 110 and the substrate 101 may be arranged between the substrate 101 and the semiconductor laser light-emitting structure 110.

The active area layer 105 may include one or more quantum wells or quantum dots. For example, the active area layer 105 may have a form in which a multi-quantum well structure is arranged between first and second cladding layers. The multi-quantum well structure may include quantum well layers and quantum barrier layers, which are alternately stacked. For example, each of the quantum well layers and quantum barrier layers may be selected from GaAs, GaIn$_x$As(0.05≤x≤0.35), GaIn$_x$P(0.3≤x≤0.7), Al$_y$GaIn$_x$P(0.3≤x≤0.7, 0.05≤y≤0.95), Al$_y$GaAs(0.05≤y≤0.95), GaAs$_z$P(0.4≤z≤0.95), and AlAs$_z$P(0.4≤z≤0.95). A wavelength of the light L1 may be determined by a composition ratio of semiconductor materials forming the quantum barrier layer and the quantum well layer and a combination of materials forming the quantum barrier layer and the quantum well layer. For example, when a GaAs-quantum well layer is applied, light having a wavelength of about 850 nm may be generated. For example, when an InGaAs-quantum well layer is applied, light having a wavelength of about 1040 nm may be generated. When a GaInP-quantum well layer is applied, light having a wavelength of about 700 nm may be generated. A material of the quantum well layer is not limited thereto, and semiconductor materials having various composition ratios may be applied as the quantum well layer to generate light in a desired infrared light band.

The first clad layer may be a semiconductor material layer having a first-type conductivity. The second clad layer may be a semiconductor material layer having a second-type conductivity. The first-type conductivity may be n-type conductivity, and the second-type conductivity may be p-type conductivity. The first-type conductivity may be p-type conductivity, and the second-type conductivity may be n-type conductivity. A p-type conductive clad layer may be obtained by doping an intrinsic semiconductor layer with an acceptor impurity, and an n-type conductive clad layer may be obtained by doping an intrinsic semiconductor layer with a donor impurity. As an example embodiment, the first and second clad layers may each include the same material as that of the quantum barrier layer. For example, when a GaInP/AlGaInP multi-quantum well structure is applied, the first and second clad layers may each include AlGaInP. For example, when a GaAs/AlGaAs multi-quantum well structure is applied, the first and second layers may each include AlGaAs.

The active area layer 105 may include quantum dots. A wavelength of the light L1 generated may be determined by the size of the quantum dots and a composition of materials configuring the quantum dots.

The first-type conductive semiconductor contact layer 103 may be on the lower distributed Bragg reflector layer 102. The first-type conductive semiconductor contact layer 103 may be between the lower distributed Bragg reflector layer 102 and the active area layer 105. The second-type conductive semiconductor contact layer 106 may be on the active area layer 105. The first-type conductivity may be n-type conductivity, and the second-type conductivity may be p-type conductivity. Alternatively, the first-type conductivity may be p-type conductivity, and the second-type conductivity may be n-type conductivity. A p-type conductive semiconductor contact layer may be obtained by doping an intrinsic semiconductor layer with an acceptor impurity, and an n-type conductive semiconductor contact layer may be obtained by doping an intrinsic semiconductor layer with a donor impurity.

A first contact pad 104 may be arranged on a portion of the first-type conductive semiconductor contact layer 103. The active area layer 105 may be arranged on the first-type conductive semiconductor contact layer 103 in an area not occupied by the first contact pad 104. A second contact pad 107 may be arranged on a portion of the second-type conductive semiconductor contact layer 106.

The semiconductor laser light-emitting structure 110 shown in FIG. 1 is an example, and the scope of the disclosure is not limited by the semiconductor laser light-emitting structure 110 shown in FIG. 1. The semiconductor laser light-emitting structure 110 may include various additional components/layers not shown in FIG. 1.

In an example embodiment, the visible light-emitting semiconductor laser device 100 has the metasurface 121 that non-linearly converts the light L1 generated by the semiconductor laser light-emitting structure 110 into the light L2 having a different wavelength. The metasurface 121 has a structure which may generate a second harmonic wave of the light L1. Second harmonic generation (SHG) is a non-linear optical process in which two photons having the same frequency interact with a non-linear structure or material to generate a new photon with twice the energy. Accordingly, a frequency of the light L2 emitted from the metasurface 121 becomes twice a frequency of the light L1 incident on the metasurface 121. For example, the semiconductor laser light-emitting structure 110 may has a VCSEL structure which generates infrared light. The metasurface 121 may non-linearly convert infrared light into visible light.

In an example embodiment, the wavelength converter 120 including the metasurface 121 is arranged on a light output side with respect to the active area layer 105, for example, a side opposite to the lower distributed Bragg reflector layer 102 with respect to the active area layer 105. The metasurface 121 may function as an upper reflector layer forming a cavity of a VCSEL by pairing up with the lower distributed Bragg reflector layer 102.

The metasurface 121 may include an array of a plurality of nanoresonators 108. The array of the plurality of nanoresonators 108 may be, for example, arranged on the second-type conductive semiconductor contact layer 106 in an area not occupied by the second contact pad 107. The metasurface 121 may also perform a feedback function of the cavity of the semiconductor laser light-emitting structure 110, that is, the VCSEL. The metasurface 121 may also include various materials used to manufacture the semiconductor laser light-emitting structure 110, for example, the VCSEL. For example, the metasurface 121 may include a Group III-V semiconductor compound, for example, GaAs, AlGaAs, InGaAs, InP, or the like. Accordingly, the semiconductor laser light-emitting structure 110 and the wavelength converter 120 may be monolithically formed by using common manufacturing operations, equipment, and materials. Depending on the materials, an operating wavelength of the visible light-emitting semiconductor laser device 100 may be shifted. The metasurface 121 and the active area layer 105 of the VCSEL may include various materials to provide a wide range of performance and flexibility.

Figure 2:
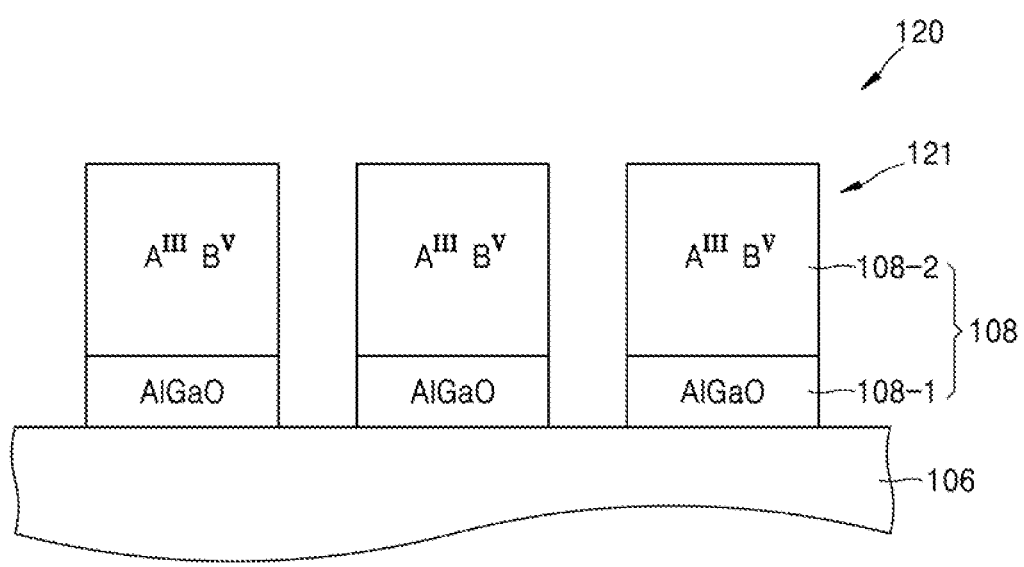
FIG. 2 shows an embodiment of a metasurface according to an example embodiment.

FIG. 2 shows an example embodiment of the metasurface 121. Referring to FIG. 2, the metasurface 121 may include the plurality of nanoresonators 108 spaced apart from one another. The plurality of nanoresonators 108 may form an array of nanoresonators 108. Each of the plurality of nanoresonators 108 may include at least one material layer. For example, each of the plurality of nanoresonators 108 may include a plurality of material layers. Each of the plurality of nanoresonators 108 of the metasurface 121 may be directly on the second-type conductive semiconductor contact layer 106. For example, the plurality of nanoresonators 108 of the metasurface 121 may respectively include spacer layers 108-1 spaced apart from each other on the second-type conductive semiconductor contact layer 106, and semiconductor compound layers 108-2 on the spacer layers 108-1. The spacer layers 108-1 may be formed on the second-type conductive semiconductor contact layer 106 to be spaced apart from each other in an area not occupied by the second contact pad 107. The spacer layers 108-1 may each be, for example, an insulating layer. The spacer layers 108-1 may each be, for example, an oxide layer. The spacer layers 108-1 may include oxides of various materials used to manufacture the semiconductor laser light-emitting structure 110, for example, the VCSEL. The semiconductor compound layers 108-2 may include various materials used to manufacture the semiconductor laser light-emitting structure 110, for example, the VCSEL. For example, the spacer layers 108-1 may each be an AlGaO layer, and the semiconductor compound layers 108-2 may each be an $A^{III}B^{V}$ semiconductor compound layer on the AlGaO layer.

Each of the plurality of nanoresonators 108 may include a low refractive index dielectric layer on the semiconductor compound layer 108-2, for example, the $A^{III}B^{V}$ semiconductor compound layer. The low refractive index dielectric layer may include, for example, $SiO_2$, polymethylmethacrylate (PMMA), benzocyclobutane (BCB), or the like. A dielectric layer is optional and does not affect an operation of the nanoresonator 108. The dielectric layer may be used as a mask when forming the array of nanoresonators 108, and may not be removed after forming the array of nanoresonators 108 to simplify a manufacturing operation of the visible light-emitting semiconductor laser device 100. The dielectric layer is not limited thereto, and may include a low refractive index dielectric material suitable as an etch mask when forming the array of nanoresonators 108.

An $A^{III}B^{V}$ semiconductor compound for the semiconductor compound layer 108-2 may be selected from $A^{III}B^{V}$ semiconductor compounds close to a material of the second-type conductive semiconductor contact layer 106 in terms of crystal structure. According to such a structure, in a manufacturing operation of the visible light-emitting semiconductor laser device 100, a stress between the semiconductor compound layer 108-2, e.g., the $A^{III}B^{V}$ semiconductor compound layer, the spacer layer 108-1, e.g., AlGaO layer, and the second-type conductive semiconductor contact layer 106 may be reduced, and the wavelength converter 120 and the semiconductor laser light-emitting structure 110 may be formed by a monolithic process.

The metasurface 121 of this type may be formed by an operation similar to an operation of manufacturing the semiconductor laser light-emitting structure 110. For example, the metasurface 121 may be formed on a light output side of the semiconductor laser light-emitting structure 110 having a VCSEL structure. An AlGaAs layer, a GaAs layer, a $SiO_2$ layer, and a PMMA layer are sequentially formed on the second-type conductive semiconductor contact layer 106 in an area not occupied by the second contact pad 107. A plurality of opening portions are formed at a position where the nanoresonator 108 is to be formed by etching the PMMA layer. The $SiO_2$ layer is partially exposed by the plurality of opening portions. Then, a metal layer, for example, a Ni layer, is formed in the plurality of opening portions, and the PMMA layer is removed. Next, the $SiO_2$ layer is etched by using the Ni layer as an etching mask to form a plurality of $SiO_2$ caps. The GaAs layer and the AlGaAs layer are etched by using the plurality of $SiO_2$ caps as an etching mask. At this time, as an etching operation, for example, an inductively coupled plasma (ICP) etching operation may be applied. Accordingly, a plurality of protrusions having a three-layer structure (AlGaAs/GaAs/$SiO_2$) is formed on the light output side of the semiconductor laser light-emitting structure 110. Next, the AlGaAs is oxidized to AlGaO. Accordingly, a plurality of nanoresonators 108 including AlGaO layer/GaAs layer/$SiO_2$ layer may be formed on the light output side of the semiconductor laser light-emitting structure 110. The AlGaO layer, the GaAs layer, and the $SiO_2$ layer respectively correspond to the spacer layer 108-1, the semiconductor compound layer 108-2, and the low refractive index dielectric layer in the embodiment shown in FIG. 2. The $SiO_2$ layer may also be removed.

In this way, the wavelength converter 120 including the metasurface 121 may be monolithically formed with the semiconductor laser light-emitting structure 110 on the semiconductor laser light-emitting structure 110, and the visible light-emitting semiconductor laser device 100 may be monolithically packed. In addition, an operation of forming the metasurface 121 is similar to an operation of manufacturing a general VCSEL, and does not require a new material or an additional special operation. Also, the metasurface 121 may be formed in various shapes and sizes within the scale of the VCSEL. That is, because the operation of forming the metasurface 121 is scalable, a manufacturing cost of the visible light-emitting semiconductor laser device 100 may be reduced. In addition, the metasurface 121 having various structures that may emit light having various wavelengths, for example, visible light, may be monolithically manufactured with the semiconductor laser light-emitting structure 110.

Figure 3:
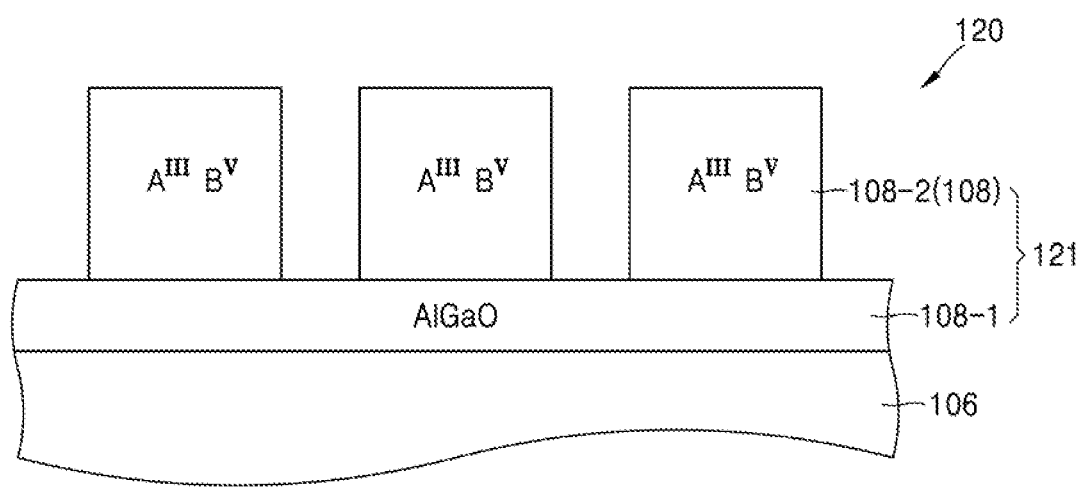
FIG. 3 shows an embodiment of a metasurface according to an example embodiment.

FIG. 3 shows an example of the metasurface 121. Referring to FIG. 3, the metasurface 121 may include a spacer layer 108-1 and a plurality of nanoresonators 108 spaced apart from one another on the spacer layer 108-1. The plurality of nanoresonators 108 may form an array of nanoresonators 108. Each of the plurality of nanoresonators 108 may include a semiconductor compound layer 108-2. The spacer layer 108-1 may be formed on the second-type conductive semiconductor contact layer 106 in an entire area not occupied by the second contact pad 107. The spacer layer 108-1 may be, for example, an insulating layer. The spacer layer 108-1 may be, for example, an oxide layer. The spacer layer 108-1 may include oxides of various materials used to manufacture the semiconductor laser light-emitting structure 110, for example, the VCSEL. The semiconductor compound layers 108-2 may include various materials used to manufacture the semiconductor laser light-emitting structure 110, for example, the VCSEL. For example, the spacer layer 108-1 may include an AlGaO layer, and the semiconductor compound layer 108-2 may include $A^{III}B^{V}$ semiconductor compounds spaced apart from each other on the AlGaO layer. As in the embodiment shown in FIG. 2, each of the plurality of nanoresonators 108 may further include a low refractive index dielectric layer arranged on the semiconductor compound layer 108-2, for example, an $A^{III}B^{V}$ semiconductor compound layer.

The metasurface 121 of this type may be formed by an operation similar to an operation of manufacturing the semiconductor laser light-emitting structure 110. For example, the metasurface 121 may be formed on the light output side of the semiconductor laser light-emitting structure 110 having a VCSEL structure. An AlGaAs layer is formed on the second-type conductive semiconductor contact layer 106 in an area not occupied by the second contact pad 107. Next, the AlGaAs layer is oxidized to AlGaO layer. A GaAs layer, a $SiO_2$ layer, and a PMMA layer are sequentially formed on the AlGaO layer. A plurality of opening portions are formed at a position where the nanoresonator 108 is to be formed by etching the PMMA layer. The $SiO_2$ layer is partially exposed by the plurality of opening portions. Then, a metal layer, for example, a Ni layer, is formed in the plurality of opening portions, and the PMMA layer is removed. Next, the $SiO_2$ layer is etched by using the Ni layer as an etching mask to form a plurality of $SiO_2$ caps. The GaAs layer is etched by using the plurality of $SiO_2$ caps as an etching mask. At this time, as an etching operation, for example, an ICP etching operation may be applied. Accordingly, the plurality of nanoresonators 108 having a two-layer structure (GaAs layer/$SiO_2$ layer) may be formed on the AlGaO layer. The AlGaO layer, the GaAs layer, and the $SiO_2$ layer respectively correspond to the spacer layer 108-1, the semiconductor compound layer 108-2, and the low refractive index dielectric layer in the embodiment shown in FIG. 3. The $SiO_2$ layer may also be removed.

A cross-sectional shape of the nanoresonator 108, the cross-sectional shape being parallel to a surface of the second-type conductive semiconductor contact layer 106, may be arbitrary. The cross-sectional shape of the nanoresonator 108 may be asymmetric. The cross-sectional shape of the nanoresonator 108 may have a shape formed by a combination of at least two or more flat geometric figures such as, for example, a square, a rectangle, a triangle, a circle, an oval, or the like. At least one of shapes and sizes of two or more selected figures may be different. The two or more selected figures may have the same shape and size.

Figure 4:
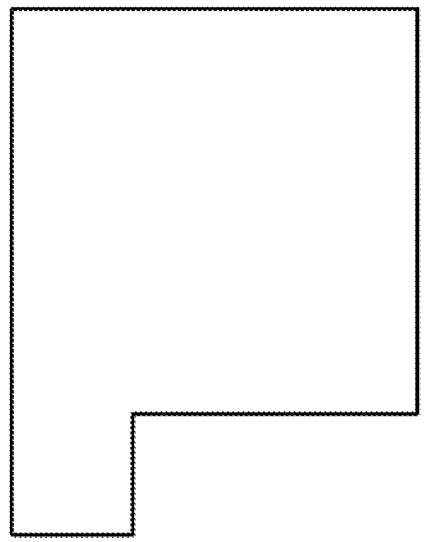
FIG. 4 shows an example of a cross-sectional shape parallel to a surface of a second-type conductive semiconductor contact layer of a nanoresonator according to an example embodiment.
Figure 5:
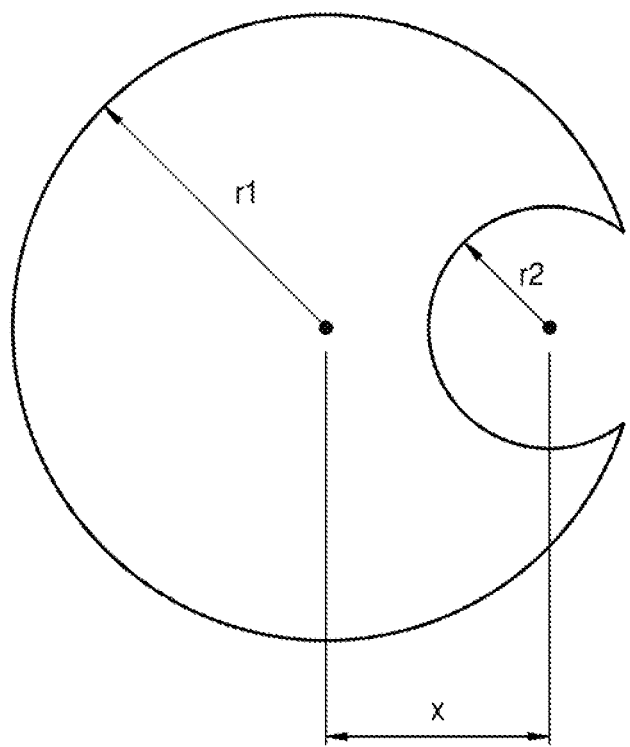
FIG. 5 shows an example of a cross-sectional shape parallel to a surface of a second-type conductive semiconductor contact layer of a nanoresonator according to an example embodiment.
Figure 6:
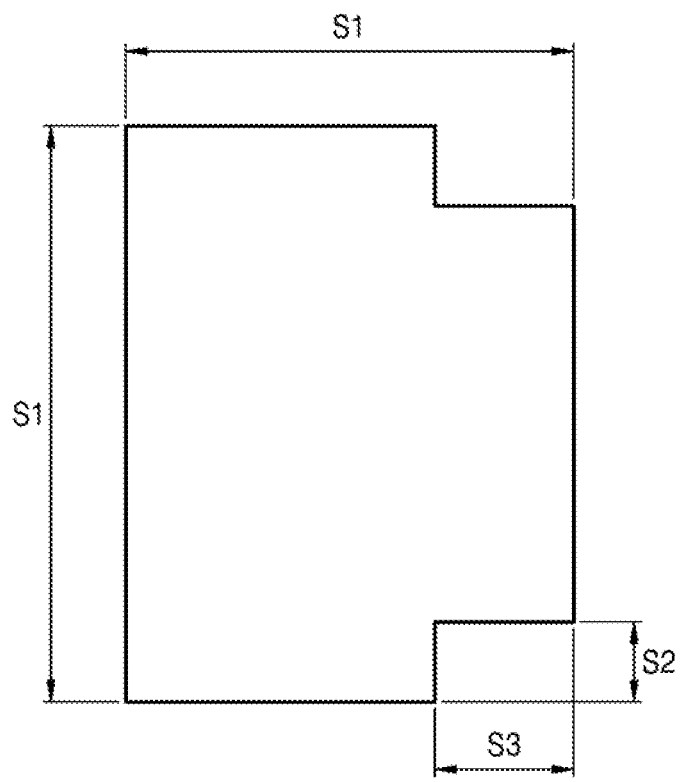
FIG. 6 shows an example of a cross-sectional shape parallel to a surface of a second-type conductive semiconductor contact layer of a nanoresonator according to an example embodiment.
Figure 7:
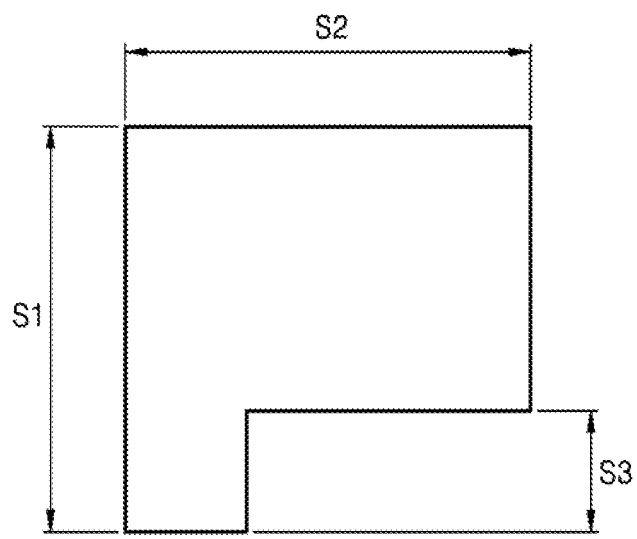
FIG. 7 shows an example of a cross-sectional shape parallel to a surface of a second-type conductive semiconductor contact layer of a nanoresonator according to an example embodiment.

A high-Q resonance mode may be provided by the nanoresonator 108 having an asymmetric cross-sectional shape, which increases the non-linear wavelength conversion efficiency of the metasurface 121. FIGS. 4 to 7 show examples of cross-sectional shapes of the nanoresonator 108. The nanoresonator 108 having a cross-sectional shape formed by a combination of two figures having the same shape and different sizes is shown as an example in FIGS. 4 to 6, and the nanoresonator 108 having a cross-sectional shape formed by a combination of two figures having different shapes and sizes is shown as an example in FIG. 7. Referring to FIG. 4, a cross-section of the nanoresonator 108 has a shape in which two squares of different sizes are combined. Referring to FIG. 5, a cross-section of the nanoresonator 108 has a shape in which two circles of different sizes are combined. Referring to FIG. 6, a cross-section of the nanoresonator 108 has a shape in which two rectangles of different sizes are combined. Referring to FIG. 7, a cross-section of the nanoresonator 108 has a shape in which a rectangle and a square are combined. According to the nanoresonator 108 having these types of asymmetric cross-sectional shapes, a reflectance peak or a transmittance peak may be obtained in a particular wavelength band, which means an enhancement of the non-linear wavelength conversion efficiency of the metasurface 121. The cross-sectional shape of the nanoresonator 108 is not limited to the examples shown in FIGS. 4 to 7.

As an example, the metasurface 121 may include the plurality of nanoresonators 108 spaced apart from one another on an AlGaO-spacer layer as shown in FIG. 3. The plurality of nanoresonators 108 may include a GaAs-semiconductor compound layer. The GaAs-semiconductor compound layer of each of the plurality of nanoresonators 108 may have a cross-sectional shape shown in FIG. 5. When a thickness of the AlGaO-spacer layer is h1, a thickness of the GaAs-semiconductor compound layer is h2, and a pitch of the GaAs-semiconductor compound layer is p, and according to an example simulation result, in a case where r1=140 nm,
r2=75 nm,
x=135 nm,
h1=500 nm,
h2=160 nm,
p=670 nm,
a high-Q resonance mode which may obtain high nonlinear conversion efficiency may be provided, and a high reflectance (reflectance peak) may be obtained at a wavelength of 1040 nm.

As an example, the metasurface 121 may include the plurality of nanoresonators 108 spaced apart from one another on an AlGaO-spacer layer as shown in FIG. 3. The plurality of nanoresonators 108 may include a GaAs-semiconductor compound layer. The plurality of nanoresonators 108 may each have a cross-sectional shape shown in FIG. 6. When a thickness of the AlGaO-spacer layer is h1, a thickness of the GaAs-semiconductor compound layer is h2, and a pitch of the GaAs-semiconductor compound layer is p3, and according to an example simulation result, in a case where S1=280 nm,
S2=45.5 nm,
S3=112 nm,
h1=200 nm,
h2=300 nm,
P3=504 nm,
a high-Q resonance mode which may obtain high nonlinear conversion efficiency is provided.

As an example, the metasurface 121 may include the plurality of nanoresonators 108 including an AlGaO-spacer layer and a GaAs-semiconductor compound layer stacked on the AlGaO-spacer layer. The plurality of nanoresonators 108 may each have a cross-sectional shape shown in FIG. 7. When a thickness of the AlGaO-spacer layer is h1, a thickness of the GaAs-semiconductor compound layer is h2, and a thickness of a $SiO_2$ layer is h3, and according to an example simulation result, in a case where S1=296 nm,
S2=296 nm,
S3=68 nm,
h1=300 nm,
h2=300 nm,
and h3=60 nm,
a high-Q resonance mode which may obtain high nonlinear conversion efficiency may be provided, and a high transmittance (transmittance peak), may be obtained at a wavelength of 1040 nm.

The simulation results described above are examples and do not limit the scope of the disclosure. Form factors of the nanoresonators 108 forming the metasurface 121 may be variously selected to provide a high-Q resonance mode which may obtain high non-linear conversion efficiency.

A form factor of the nanoresonator 108, for example, parameters defining a cross-sectional shape and thickness may be determined using various numerical optimization techniques. The numerical optimization techniques may include, for example, a finite difference tie domain (FDTD) method, a finite element method (FEM), or the like. However, a method of determining the parameters of the nanoresonator 108 is not limited to the above-described methods, and may be performed by other suitable methods. The nanoresonators 108 of the metasurface 121 are required to realize lowest excitation of resonance in the vicinity of an emission wavelength of the semiconductor laser light-emitting structure 110, for example, a VSCEL. The parameters of the nanoresonator 108 may be obtained from calculation of the multiplicity of the emission wavelength and the size of the nanoresonator 108 by considering a refractive index of a material forming the nanoresonator 108. The parameters of the nanoresonator 108 may be determined to obtain light having a desired wavelength by a numerical optimization technique.

As described above, the metasurface 121 may perform a feedback function of the semiconductor laser light-emitting structure 110, for example, a cavity of a VCSEL. In other words, the metasurface 121 may function as an upper reflector layer paired with the lower distributed Bragg reflector layer 102 of the semiconductor laser light-emitting structure 110. To this end, the parameters of the nanoresonators 108 forming the metasurface 121 may be selected to have high reflection characteristics with respect to light emitted from the semiconductor laser light-emitting structure 110.

A pulsed laser, which has the same average power as a non-pulsed laser, has a higher peak energy, which is important to increase the non-linear conversion efficiency of light emitted from a VCSEL to visible light. A saturable absorber is one of main components of a pulsed laser. The saturable absorber operates like a mirror and allows a pulse of light to pass through when saturated with sufficient energy. When a pulsed VCSEL is used in the semiconductor laser light-emitting structure 110 of the visible light-emitting semiconductor laser device 100, due to a carrier injection mechanism in the $A^{III}B^{V}$ semiconductor compound layer 108-2 of the nanoresonator 108, the metasurface 121 may additionally operate as a saturable absorber, which increases the non-linear conversion efficiency in a pulsed mode.

FIGS. 8A to 8F show an example embodiment of a method of manufacturing the visible light-emitting semiconductor laser device 100. Hereinafter, an example embodiment of a method of manufacturing the visible light-emitting semiconductor laser device 100 is described.

Figure 8A:
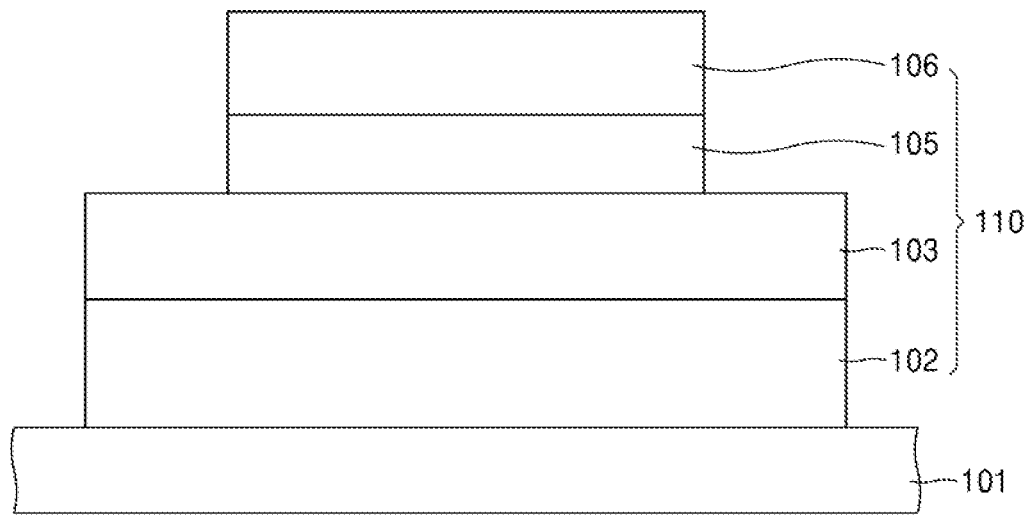
FIGS. 8A to 8G are diagrams showing an embodiment of a method of manufacturing a visible light-emitting semiconductor laser device.

First, referring to FIG. 8A, the substrate 101 is prepared, and the semiconductor laser light-emitting structure 110 is formed on the substrate 101. The substrate 101 may be, for example, a semiconductor substrate. In an example embodiment, a GaAs substrate is used. The semiconductor laser light-emitting structure 110 may be formed by growing a Group III-V compound semiconductor material on the substrate 101. The semiconductor laser light-emitting structure 110 may include, for example, GaInP, AlGaInP, GaAs, GaInAs, AlGaAs, or AlGaInAs. The semiconductor laser light-emitting structure 110 may have a VCSEL structure. Various known operations may be used for an operation of forming the semiconductor laser light-emitting structure 110 having the VCSEL structure, and are briefly described below.

The lower distributed Bragg reflector layer 102 is formed on the substrate 101. The lower distributed Bragg reflector layer 102 may be formed by alternately stacking a low refractive index layer having a relatively low refractive index and a high refractive index layer having a relatively high refractive index on the substrate 101. The lower distributed Bragg reflector layer 102 may include a Group III-V semiconductor compound, for example, AlGaAs.

The first-type conductive semiconductor contact layer 103 is formed on the lower distributed Bragg reflector layer 102. The first-type conductive semiconductor contact layer 103 may include a Group III-V semiconductor compound. The first-type conductive semiconductor contact layer 103 may have an n-type conductivity or a p-type conductivity. For example, the first-type conductive semiconductor contact layer 103 may have an n-type conductivity. The first-type conductive semiconductor contact layer 103 may be obtained by doping a Group III-V semiconductor compound with a donor impurity.

The active area layer 105 is formed on the first-type conductive semiconductor contact layer 103. A first clad layer, a multi-quantum well structure, and a second clad layer may be sequentially formed by crystal growth of a Group III-V compound semiconductor material on the first-type conductive semiconductor contact layer 103 to form the active area layer 105. The Group III-V compound semiconductor materials and a composition ratio thereof of a quantum barrier layer and a quantum well layer forming the multi-quantum well structure may be appropriately selected according to a wavelength of the light L1. As an example, the first clad layer and the second clad layer may include the same material as that of the quantum barrier layer of the multi-quantum well structure.

The second-type conductive semiconductor contact layer 106 is formed on the active area layer 105. The second-type conductive semiconductor contact layer 106 may include a Group III-V semiconductor compound. The second-type conductive semiconductor contact layer 106 may have an n-type conductivity or a p-type conductivity. For example, the second-type conductive semiconductor contact layer 106 may have a p-type conductivity. The second semiconductor contact layer 106 may be obtained by doping a Group III-V semiconductor compound with an acceptor impurity.

Next, an operation of monolithically forming the wavelength converter 120 including the metasurface 121 with the semiconductor laser light-emitting structure 110 on the light output side of the semiconductor laser light-emitting structure 110 is performed.

Figure 8B:
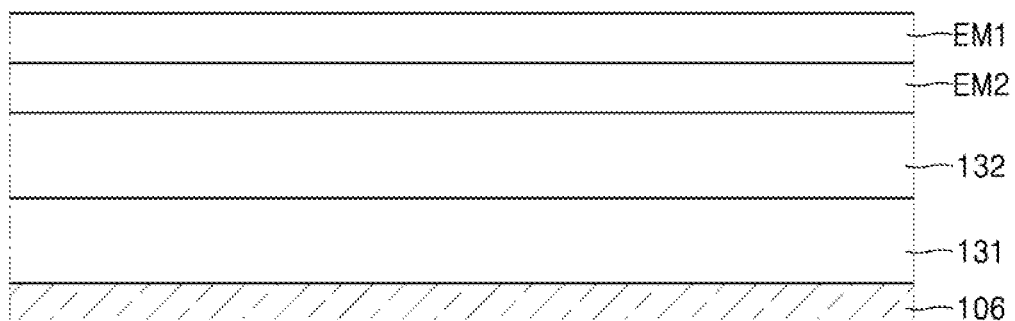

First, referring to FIG. 8B, a first material layer 131, a second material layer 132, a second etch mask layer EM2, and a first etch mask layer EM1 are sequentially formed on the second-type conductive semiconductor contact layer 106. The first material layer 131 and the second material layer 132 may include various materials used for manufacturing the semiconductor laser light-emitting structure 110, for example, a VCSEL. The second material layer 132 may be an $A^{III}B^{V}$ semiconductor compound layer. In an example embodiment, the first material layer 131 is an AlGaAs layer, and the second material layer 132 is a GaAs layer. The second etch mask layer EM2 may include, for example, a low refractive index dielectric. For example, the second etch mask layer EM2 and the first etch mask layer EM1 may be a $SiO_2$ layer and a PMMA layer, respectively.

Figure 8C:
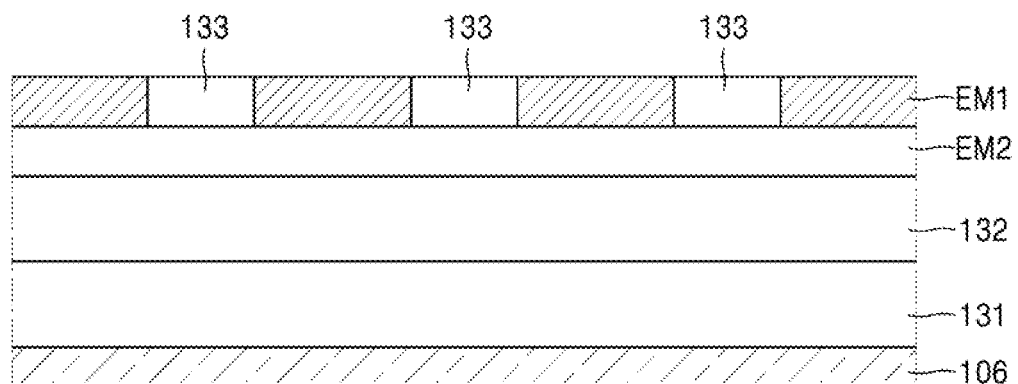

Next, shown in FIG. 8C, the first etch mask layer EM1 is etched to form a plurality of opening portions 133 exposing the second etch mask layer EM2 in the first etch mask layer EM1. This operation may be performed, for example, by E-beam lithography. A cross-sectional shape of the nanoresonator 108 may be determined by a shape of the plurality of opening portions 133. For example, the shape of the plurality of opening portions 133 may have the shapes shown in FIGS. 4 to 7.

Figure 8D:
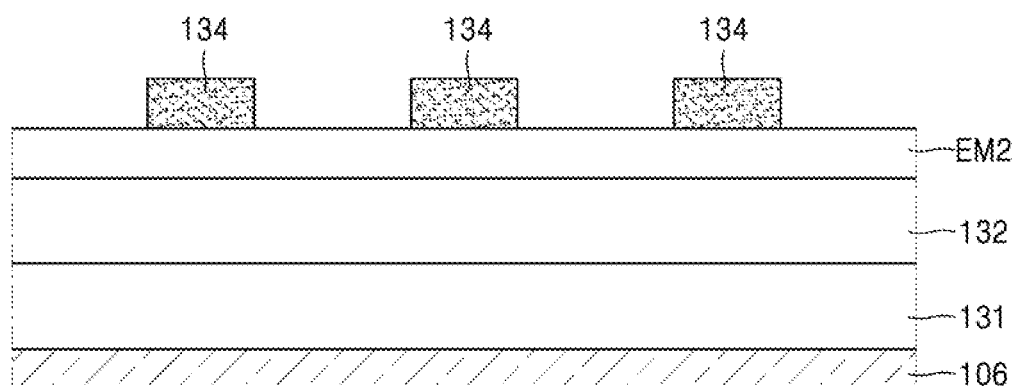
Figure 8E:
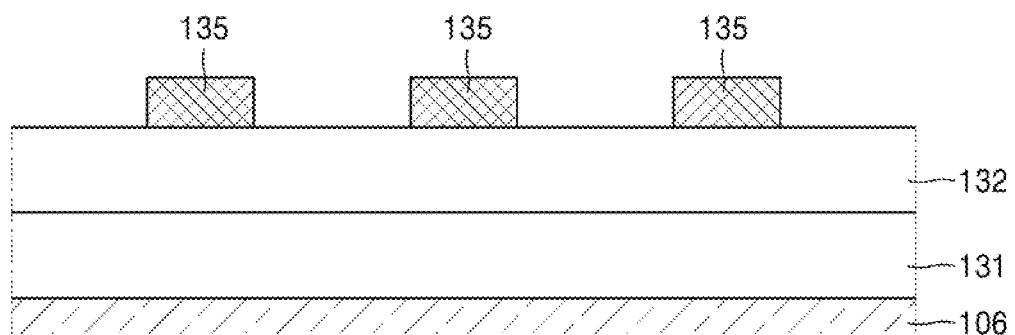

Then, as shown in FIG. 8D, a plurality of metal layers 134 spaced apart from one another are formed by stacking a metal, for example, Ni, in the plurality of opening portions 133 and removing the first etch mask layer EM1. For example, dry etching is performed on the second etch mask layer EM2 by using the plurality of metal layers 134 as an etch mask. By removing the plurality of metal layers 134, as shown in FIG. 8E, a plurality of caps 135 spaced apart from one another are formed on the second material layer 132.

Figure 8F:
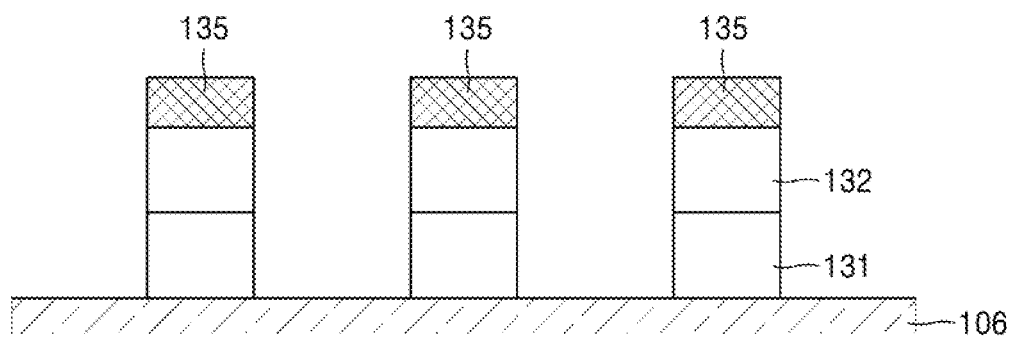

Next, the second material layer 132 and the first material layer 131 are etched by using the plurality of caps 135 as an etch mask to form a plurality of protrusions each including the first material layer 131 and the second material layer 132, and a cap 135 and spaced apart from one another on the second-type conductive semiconductor contact layer 106, as shown in FIG. 8F. An etching operation may be performed, for example, by an ICP etching operation. Next, AlGaAs forming the first material layer 131 is oxidized to AlGaO. The oxidized first material layer 131, the second material layer 132, and the cap 135 respectively correspond the spacer layer 108-1, the semiconductor compound layer 108-2, and the low refractive index dielectric layer of the nanoresonator 108 shown in FIG. 2. The cap 135 may also be removed.

Figure 8G:
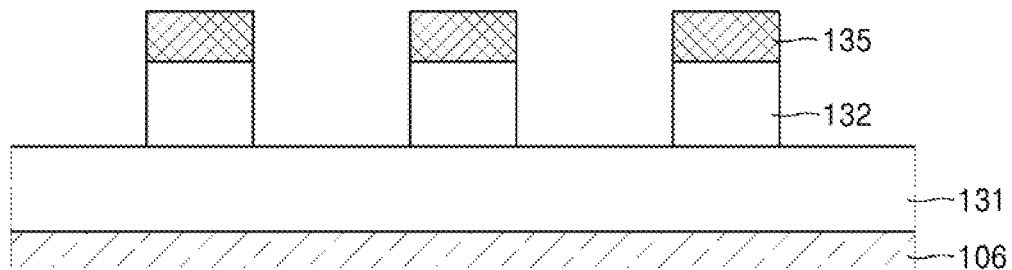

For example, the second material layer 132 is etched by using the plurality of caps 135 as an etch mask to form a plurality of protrusions each including the second material layer 132 and the cap 135 and spaced apart from one another on the first material layer 131 entirely formed on an upper surface of the second-type conductive semiconductor contact layer 106 as shown in FIG. 8G. An etching operation may be performed, for example, by an ICP etching operation. Next, AlGaAs forming the first material layer 131 is oxidized to AlGaO. The oxidized first material layer 131, the second material layer 132, and the cap 135 respectively correspond the spacer layer 108-1, and the semiconductor compound layer 108-2 and the low refractive index dielectric layer of the nanoresonator 108 shown in FIG. 3. The cap 135 may also be removed.

Next, the first contact pad 104 is formed on the first-type conductive semiconductor contact layer 103 in an area not occupied by the active area layer 105, and the second contact pad 107 is formed on the second-type conductive semiconductor contact layer 106 in an area not occupied by the metasurface 121.

Accordingly, the visible light-emitting semiconductor laser device 100, as shown in FIG. 1, in which the wavelength converter 120 including the metasurface 121 including the plurality of nanoresonators 108 is monolithically formed with the light output side of the semiconductor laser light-emitting structure 110 on the light output side of the semiconductor laser light-emitting structure 110, may be manufactured.

The embodiment of the above-described manufacturing method is illustrative, and an order of forming the plurality of nanoresonators 108, the first contact pad 104, and the second contact pad 107 may be appropriately selected for a technology for manufacturing a semiconductor device.

Figure 9:
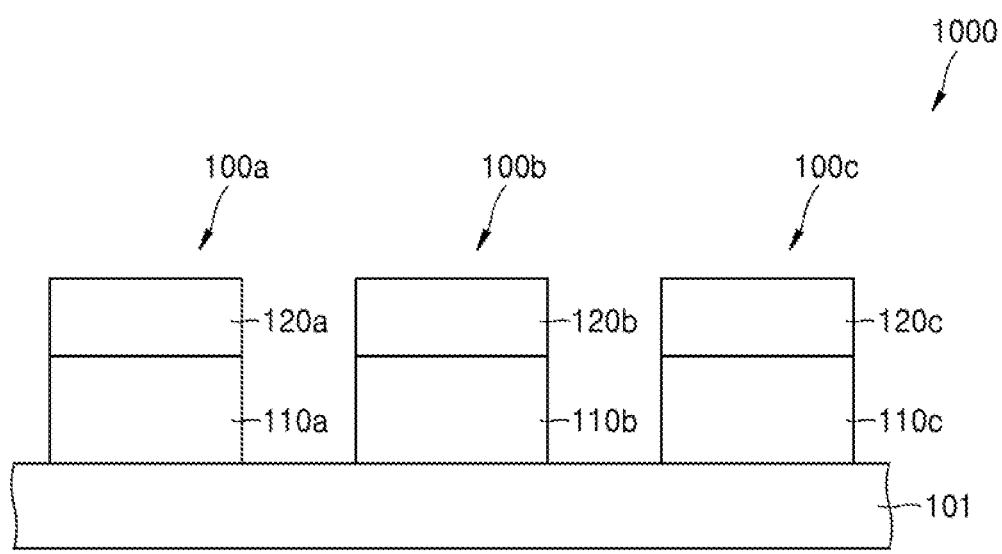
FIG. 9 shows an example of a visible light-emitting semiconductor laser device according to an example embodiment.

FIG. 9 is a schematic configuration diagram of an example embodiment of a semiconductor laser device 1000. Referring to FIG. 9, the semiconductor laser device 1000 may include a plurality of sub-semiconductor laser devices arranged on the substrate 101. For example, the semiconductor laser device 1000 may include sub-semiconductor laser devices 100a, 100b, and 100c. Each of the sub-semiconductor laser devices 100a, 100b, and 100c has a structure in which the semiconductor laser light-emitting structure 110 and the wavelength converter 120 are monolithically formed as shown in FIGS. 1 to 3.

The sub-semiconductor laser devices 100a, 100b, and 100c may emit light of different colors from one another. For example, the sub-semiconductor laser devices 100a, 100b, and 100c may emit visible light having different colors from one another. For example, semiconductor laser light-emitting structures 110a, 110b, and 110c of the sub-semiconductor laser devices 100a, 100b, and 100c may emit infrared light having different wavelengths from one another. Wavelength converters 120a, 120b, and 120c of the sub-semiconductor laser devices 100a, 100b, and 100c may then convert infrared light having different wavelengths from one another emitted by the semiconductor laser light-emitting structures 110a, 110b, and 110c into visible light having different wavelengths from one another. For example, the semiconductor laser light-emitting structures 110a, 110b, and 110c may respectively emit infrared light having wavelengths of 850 nm, 1040 nm, and 700 nm by selecting materials of forming a quantum well structure of each of the semiconductor laser light-emitting structures 110a, 110b, and 110c as GaAs, InGaAs, and GaInP, respectively. The wavelength converters 120a, 120b, and 120c may then convert infrared light having wavelengths of 850 nm, 1040 nm, and 700 nm into visible light having wavelengths of 425 nm, 520 nm, and 350 nm, respectively.

According to the semiconductor laser device 1000 having such a structure, a plurality of semiconductor laser devices (e.g., the sub-semiconductor laser devices 100a, 100b, and 100c) emitting visible light having different wavelengths from one another may be manufactured to be, for example, an array on a single substrate. The semiconductor laser device 1000 having this structure may be used, for example, as a display matrix of TVs, smartphones, computers, and other devices including display screens.

Figure 10:
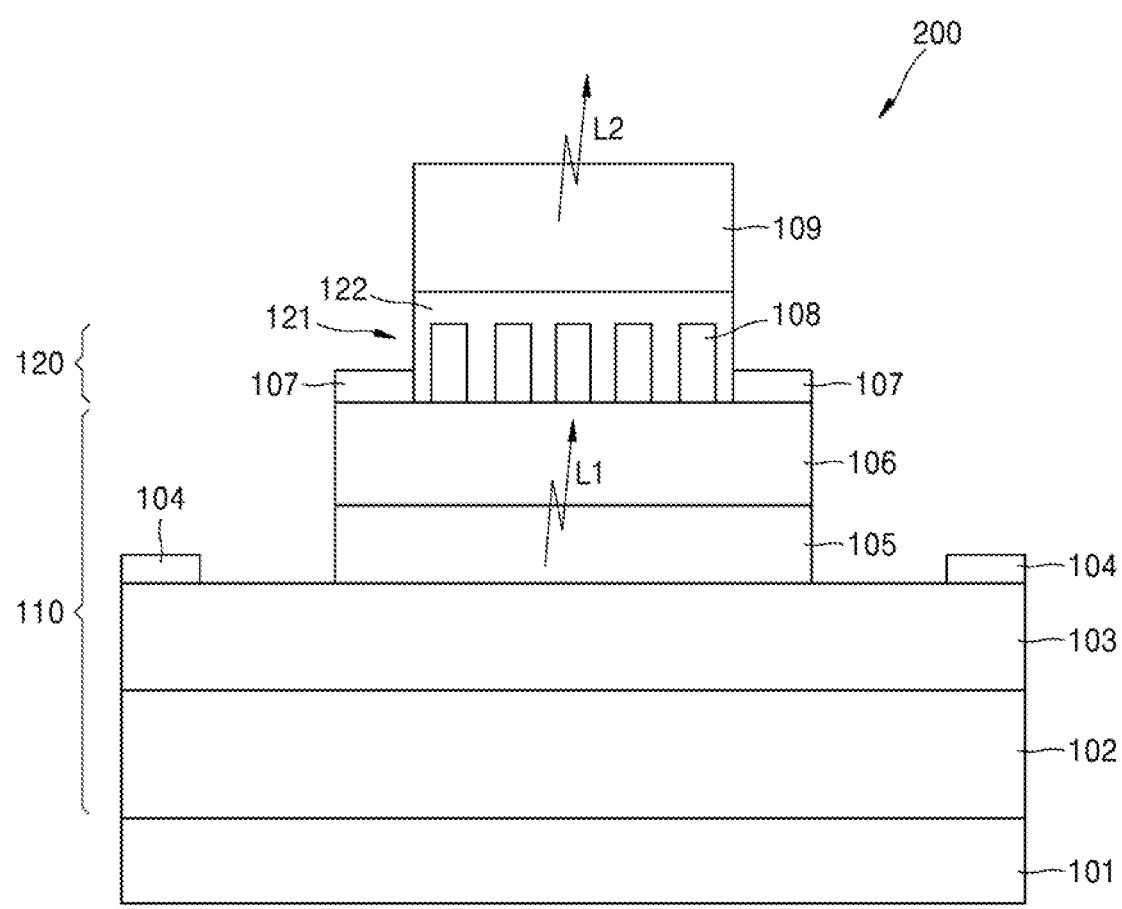
FIG. 10 shows an example of a visible light-emitting semiconductor laser device according to an example embodiment.

FIG. 10 schematically shows an example embodiment of a semiconductor laser device 200 in which the semiconductor laser light-emitting structure 110 and the wavelength converter 120 are integrated. An example embodiment of the semiconductor laser device 200 shown in FIG. 10 is different from the embodiment of the visible light-emitting semiconductor laser device 100 shown in FIG. 1 in that an upper reflector layer is included and the wavelength converter 120 including the metasurface 121 is arranged between the active area layer 105 and the upper reflector layer. Hereinafter, differences thereof are mainly described.

Referring to FIG. 10, the semiconductor laser device 200 includes the semiconductor laser light-emitting structure 110 formed on the substrate 101, the wavelength converter 120 monolithically formed with the semiconductor laser light-emitting structure 110 on the light output side of the semiconductor laser light-emitting structure 110, and an upper distributed Bragg reflector layer 109 on a light output side of the wavelength converter 120.

The semiconductor laser light-emitting structure 110 includes the lower distributed Bragg reflector layer 102, the first-type conductive semiconductor contact layer 103, the first contact pad 104, the active area layer 105, the second-type conductive semiconductor contact layer 106, and the second contact pad 107. The semiconductor laser light-emitting structure 110 may include a Group III-V semiconductor compound. The semiconductor laser light-emitting structure 110 shown in FIG. 10 is an example, and the scope of the disclosure is not limited to the semiconductor laser light-emitting structure 110 shown in FIG. 10. The semiconductor laser light-emitting structure 110 may include various additional components/layers not shown in FIG. 10.

The wavelength converter 120 non-linearly converts the light L1 into the light L2 having a different wavelength. For example, the wavelength converter 120 may non-linearly convert infrared light emitted by the semiconductor laser light-emitting structure 110 into visible light. The wavelength converter 120 includes the metasurface 121. The metasurface 121 may include an array of nanoresonators 108. A structure of the wavelength converter 120 may be the same as that described with reference to FIGS. 1 to 7.

The wavelength converter 120 is positioned on an opposite side of the lower distributed Bragg reflector layer 102 with respect to the active area layer 105, and is positioned between the active area layer 105 and the upper distributed Bragg reflector layer 109. The upper distributed Bragg reflector layer 109 may be formed by stacking a low refractive index layer having a relatively low refractive index and a high refractive index layer having a relatively high refractive index. The upper distributed Bragg reflector layer 109 may be on the metasurface 121. The wavelength converter 120 may include a transparent dielectric layer 122 covering the metasurface 121. A space between the nanoresonators 108 may be filled by the transparent dielectric layer 122. The metasurface 121 may be buried in the transparent dielectric layer 122. A space between the metasurface 121 and the upper distributed Bragg reflector layer 109 may be filled by the transparent dielectric layer 122. The upper distributed Bragg reflector layer 109 may be on the transparent dielectric layer 122. The transparent dielectric layer 122 may include, for example, $SiO_2$, PMMA, BCB, or the like. A material forming the transparent dielectric layer 122 is not limited thereto, and may be an appropriate transparent dielectric that may be used in a manufacturing operation of a semiconductor device.

Form factors of the nanoresonators 108, for example, parameters defining a cross-sectional shape and thickness may be determined using various numerical optimization techniques. The numerical optimization techniques may include, for example, a finite-difference time domain (FDTD) method, a finite element method (FEM), or the like. However, a method of determining the parameters of the nanoresonator 108 is not limited to the above-described methods, and may be performed by other suitable methods. The parameters of the nanoresonators 108 may be selected to provide a high transmittance for the light L1 emitted by the semiconductor laser light-emitting structure 110, for example, a VCSEL.

When the semiconductor laser light-emitting structure 110 is a pulsed VCSEL, the semiconductor laser device 200 may further include a saturable absorber between the wavelength converter 120 and the upper distributed Bragg reflector layer 109.

An example embodiment of a method of manufacturing the semiconductor laser device 200 shown in FIG. 10 is briefly described. As described above with reference to FIGS. 8A to 8G, the semiconductor laser light-emitting structure 110 is formed on the substrate 101, and the metasurface 121 is formed on the light output side of the semiconductor laser light-emitting structure 110. Next, the transparent dielectric layer 122 is formed by coating a transparent dielectric on the metasurface 121. The transparent dielectric layer 122 may fill between the nanoresonators 108. A thickness of the transparent dielectric layer 122 may be greater than a thickness of the nanoresonators 108. The transparent dielectric layer 122 may include, for example, $SiO_2$, PMMA, BCB, or the like. A material forming the transparent dielectric layer 122 is not limited thereto, and may be an appropriate transparent dielectric that may be used in a manufacturing operation of a semiconductor device.

Then, the upper distributed Bragg reflector layer 109 is formed on the transparent dielectric layer 122. The upper distributed Bragg reflector layer 109 may be formed by alternately stacking a low refractive index layer having a relatively low refractive index and a high refractive index layer having a relatively high refractive index. Next, the first contact pad 104 is formed on the first-type conductive semiconductor contact layer 103 in an area not occupied by the active area layer 105, and the second contact pad 107 is formed on the second-type conductive semiconductor contact layer 106 in an area not occupied by the metasurface 121. Accordingly, the semiconductor laser device 200 having the wavelength converter 120 monolithically formed with the semiconductor laser light-emitting structure 110 shown in FIG. 10 may be manufactured.

The example embodiment of the above-described manufacturing method is illustrative, and an order of forming the plurality of nanoresonators 108, the first contact pad 104, and the second contact pad 107 may be appropriately selected for a technology for manufacturing a semiconductor device.

The sub-semiconductor laser devices 100a, 100b, and 100c shown in FIG. 9 may be replaced with semiconductor laser devices 200 shown in FIG. 10. In this case, semiconductor laser light-emitting structures of the semiconductor laser devices 200 may emit infrared light having different wavelengths, respectively, and wavelength converters of the semiconductor laser device 200 may convert infrared light emitted by the semiconductor laser light-emitting structures into visible light having different wavelengths from one another. According to the semiconductor laser device 1000 having such a structure, a plurality of semiconductor laser devices 200 emitting visible light having different wavelengths from one another may be manufactured to be arranged, for example, in an array on a single substrate. The semiconductor laser device 1000 having this structure may be used, for example, as a display matrix of TVs, smartphones, computers, and other devices including display screens.

Figure 11:
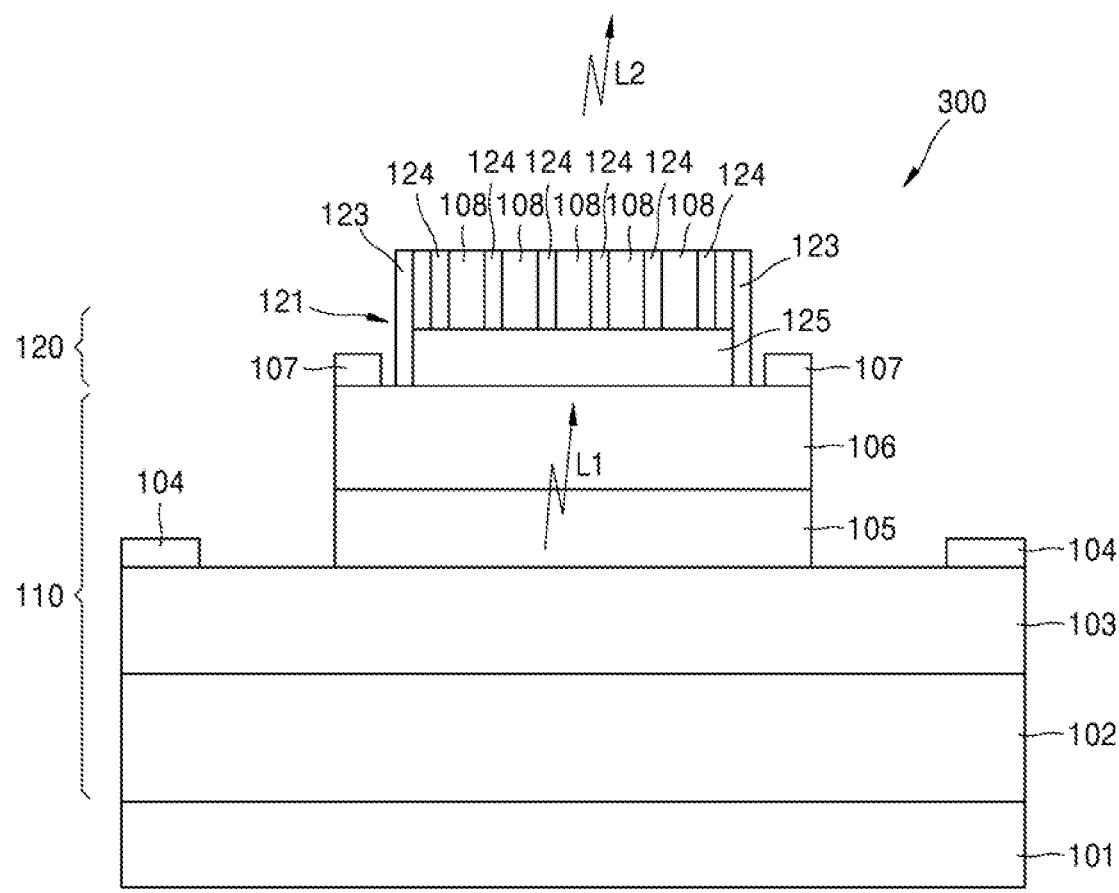
FIG. 11 shows an example of a visible light-emitting semiconductor laser device according to an example embodiment.

FIG. 11 schematically shows an example embodiment of a semiconductor laser device 300 in which the semiconductor laser light-emitting structure 110 and the wavelength converter 120 are integrated. An example embodiment of the semiconductor laser device 300 shown in FIG. 11 is different from the embodiment of the visible light-emitting semiconductor laser device 100 shown in FIG. 11 in that an air gap 125 is formed between the metasurface 121 forming the wavelength converter 120 and the semiconductor laser light-emitting structure 110. Hereinafter, differences thereof are mainly described. Referring to FIG. 11, the semiconductor laser device 300 may include the semiconductor laser light-emitting structure 110 formed on the substrate 101, the wavelength converter 120 including the metasurface 121 and monolithically formed with the semiconductor laser light-emitting structure 110 on the light output side of the semiconductor laser light-emitting structure 110, the air gap 125 between the metasurface 121 and the semiconductor laser light-emitting structure 110.

The semiconductor laser light-emitting structure 110 includes the lower distributed Bragg reflector layer 102, the first-type conductive semiconductor contact layer 103, the first contact pad 104, the active area layer 105, the second-type conductive semiconductor contact layer 106, and the second contact pad 107. The semiconductor laser light-emitting structure 110 may include a Group III-V semiconductor compound. The semiconductor laser light-emitting structure 110 shown in FIG. 11 is an example, and the scope of the disclosure is not limited to the semiconductor laser light-emitting structure 110 shown in FIG. 11. The semiconductor laser light-emitting structure 110 may include various additional components/layers.

The wavelength converter 120 non-linearly converts the light L1 into the light L2 having a different wavelength. For example, the wavelength converter 120 may non-linearly convert infrared light emitted by the semiconductor laser light-emitting structure 110 into visible light. The wavelength converter 120 includes the metasurface 121. The metasurface 121 may include an array of nanoresonators 108. A structure of the wavelength converter 120 may be the same as that as described with reference to FIGS. 1 to 7. However, because the air gap 125 may replace the spacer layer 108-1 in FIGS. 2 and 3, the spacer layer 108-1 may be omitted.

The wavelength converter 120 may include the metasurface 121 spaced apart from the second-type conductive semiconductor contact layer 106, sidewalls 123 positioned on the second-type conductive semiconductor contact layer 106 and positioned outside the metasurface 121, and straps 124 connecting the nanoresonators 108 of the metasurface 121 and the sidewalls 123. The sidewalls 123 may be, for example, in a form of partially or entirely surrounding the metasurface 121. The sidewalls 123 may be formed by being stacked on the second-type conductive semiconductor contact layer 106. The sidewalls 123, the array of nanoresonators 108, and the straps 124 may each include an $A^{III}B^V$ semiconductor compound.

The $A^{III}B^V$ semiconductor compound for the nanoresonators 108, the sidewalls 123, and the straps 124 may be selected from an $A^{III}B^V$ semiconductor compound close to a material of the second-type conductive semiconductor contact layer 106. The selection of this material is made because a use of a material having a crystal structure close to that of the nanoresonators 108, the sidewalls 123, the straps 124, and the second-type conductive semiconductor contact layer 106 may reduce a stress between sidewalls 123 of a $A^{III}B^V$ semiconductor compound layer and the second-type conductive semiconductor contact layer 106 and form a single structure.

Form factors of the nanoresonators 108, for example, parameters defining a cross-sectional shape and thickness may be determined using various numerical optimization techniques. The numerical optimization techniques may include, for example, an FDTD method, an FEM, or the like. However, a method of determining the parameters of the nanoresonator 108 is not limited to the above-described methods, and may be performed by other suitable methods. The parameters of the nanoresonators 108 may be selected to provide a high transmittance for the light L1 emitted by the semiconductor laser light-emitting structure 110, for example, a VCSEL.

The metasurface 121 of an embodiment may function as an upper reflector layer forming a cavity of a VCSEL by pairing up with the lower distributed Bragg reflector layer 102. Heights (e.g., thicknesses) of the nanoresonators 108 may be the same.

FIGS. 12A to 12D show an example embodiment of a method of manufacturing the semiconductor laser device 300 shown in FIG. 11. An example embodiment of the method of manufacturing the semiconductor laser device 300 shown in FIG. 11 is briefly described with references to FIGS. 8A and FIGS. 12A to 12D.

First, as described above with reference to FIG. 8A, the semiconductor laser light-emitting structure 110 is formed on the substrate 101. Next, an operation of monolithically forming the wavelength converter 120 including the metasurface 121 with the semiconductor laser light-emitting structure 110 on the light output side of the semiconductor laser light-emitting structure 110 is performed.

Figure 12A:
FIGS. 12A to 12D are diagrams showing an example embodiment of a method of manufacturing a visible light-emitting semiconductor laser device.
Figure 12B:
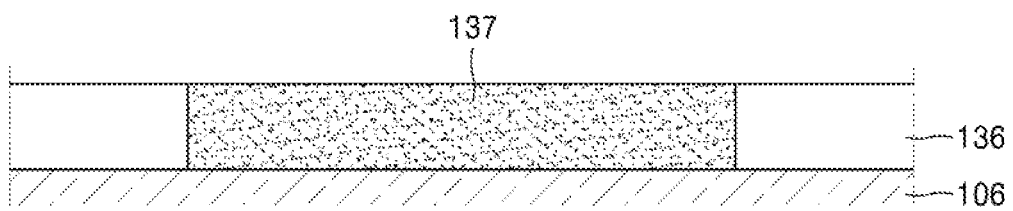

Referring to FIG. 12A, a material layer 136 is formed on the second-type conductive semiconductor contact layer 106. The material layer 136 may also include various materials used to manufacture the semiconductor laser light-emitting structure 110, for example, a VCSEL. The material layer 136 may include an AIIIBV semiconductor compound layer. The material layer 136 is etched to partially expose the second-type conductive semiconductor contact layer 106. As shown in FIG. 12B, a sacrificial layer 137 is stacked on an exposed surface of the second-type conductive semiconductor contact layer 106.

Figure 12C:
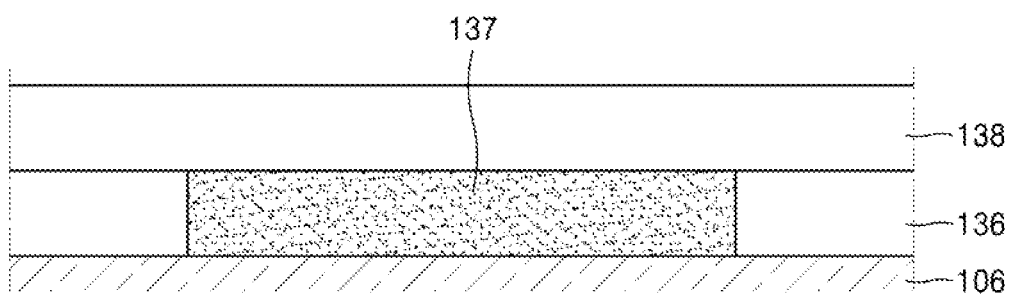
Figure 12D:
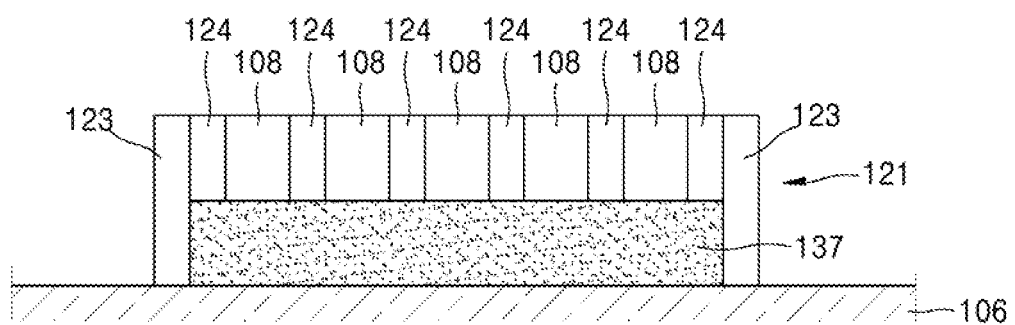

As shown in FIG. 12C, a material layer 138 is stacked on the material layer 136 and the sacrificial layer 137. The material layer 138 may include the same material as that of the material layer 136. The material layer 138 may include, for example, an $A^{III}B^V$ semiconductor compound layer. Next, the material layer 138 is etched to form the sidewalls 123, an array of nanoresonators 108, and the straps 124 as shown in FIG. 12D. This operation may be performed by an etching operation using an etch mask.

The sacrificial layer 137 between the second-type conductive semiconductor contact layer 106 and the metasurface 121 is removed. The operation may be performed, for example, by a wet etching operation. Accordingly, as shown in FIG. 11, the wavelength converter 120 is formed that includes the air gap 125 between the second-type conductive semiconductor contact layer 106 and the metasurface 121.

Next, the first contact pad 104 is formed on the first-type conductive semiconductor contact layer 103 in an area not occupied by the active area layer 105, and the second contact pad 107 is formed on the second-type conductive semiconductor contact layer 106 in an area not occupied by the metasurface 121. Accordingly, the semiconductor laser device 300, as shown in FIG. 11, in which the wavelength converter 120 including the metasurface 121 including the plurality of nanoresonators 108 is monolithically formed with the semiconductor laser light-emitting structure 110 on the light output side of the semiconductor laser light-emitting structure 110 with the air gap 125 therebetween, may be manufactured.

The example embodiment of the above-described method is illustrative, and an order of forming the nanoresonators 108, the sidewalls 123, the straps 124, the first contact pad 104, and the second contact pad 107 may be appropriately selected for the technology of manufacturing a semiconductor device.

The sub-semiconductor laser devices 100a, 100b, and 100c shown in FIG. 9 may be replaced with semiconductor laser devices 300 shown in FIG. 11. In this case, semiconductor laser light-emitting structures of the semiconductor laser devices 300 may emit infrared light having different wavelengths, respectively, and wavelength converters of the semiconductor laser device 300 may convert infrared light emitted by the semiconductor laser light-emitting structures into visible light having different wavelengths from one another. According to the semiconductor laser device 1000 shown in FIG. 9 having such a structure, a plurality of semiconductor laser device 300 emitting visible light having different wavelengths from one another may be manufactured to be, for example, an array on a single substrate. The semiconductor laser device 1000 having this structure may be used, for example, as a display matrix of TVs, smartphones, computers, and other devices including display screens.

Monolithic integration between the metasurface 121 and the semiconductor laser light-emitting structure 110, for example, a VCSEL, does not require additional assembly and packaging, and an entire structure thereof is manufactured by a single manufacturing operation, and mass production is possible. In addition, the metasurface 121 is made of a material used for manufacturing the semiconductor laser light-emitting structure 110 without a need for a new material. This means that the metasurface 121 does not require new manufacturing equipment and may be manufactured by using manufacturing operation equipment of the semiconductor laser light emitting structure 110, for example, a VCSEL. Accordingly, the semiconductor laser devices 100, 200, and 300 shown respectively in FIGS. 1, 10, and 11 emitting stable and reliable visible light may be manufactured by monolithic integration of the metasurface 121 and the semiconductor laser light-emitting structure 110, for example, a VCSEL. The metasurface 121 provided directly on the semiconductor laser light-emitting structure 110, for example, a VCSEL, is very thin, which may provide the semiconductor laser devices 100, 200, 300 which are very compact, to be integrated into a mobile device. An arrangement of the semiconductor laser devices 100, 200, and 300 emitting visible light having different wavelengths may be used in a color display and a projector. That is, a semiconductor laser device according to embodiments of the disclosure may be applied to a color display, various projectors, virtual/augmented reality glasses, a retina projector, a mobile device, or the like.

According to the above-described example embodiments, a visible light-emitting semiconductor laser device having operational stability may be implemented.

According to the above-described example embodiments, a visible light-emitting semiconductor laser device having a high emission power may be implemented.

According to the above-described example embodiments, a visible light-emitting semiconductor laser device having a long lifespan may be implemented.

According to the above-described example embodiments, a visible light-emitting semiconductor laser device which is compact and may be manufactured in a single chip may be manufactured.

According to the above-described example embodiments, a visible light-emitting semiconductor laser device capable of easily manufacturing a plurality of structures emitting light having different wavelengths on a single wafer may be implemented.

In the above, a semiconductor laser device and a manufacturing method have been described with reference to the example embodiments shown in the drawings, but these are only examples, and it will be understood by those of ordinary skill in the art that modifications and equivalent other embodiments are possible therefrom. Accordingly, the true technical protection scope of the disclosure should be defined by appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor laser device comprising:
a semiconductor laser light-emitting structure having a vertical-cavity surface-emitting laser structure, the semiconductor laser light-emitting structure being configured to emit light having a first wavelength;
a wavelength converter comprising a metasurface, the wavelength converter being monolithically formed with the semiconductor laser light-emitting structure on a light output side of the semiconductor laser light-emitting structure; and
an air gap between the metasurface and the semiconductor laser light-emitting structure,
wherein the metasurface is configured to non-linearly convert the light having the first wavelength into light having a second wavelength.

2. The semiconductor laser device of claim 1, wherein the semiconductor laser light-emitting structure is further configured to emit infrared light, and
wherein the wavelength converter is further configured to non-linearly convert the infrared light into visible light.

3. The semiconductor laser device of claim 1, wherein each of the semiconductor laser light-emitting structure and the metasurface comprises a Group III-V semiconductor compound.

4. The semiconductor laser device of claim 1, wherein the metasurface comprises a plurality of nanoresonators, and each of the plurality of nanoresonators has an asymmetric cross-sectional shape.

5. The semiconductor laser device of claim 4, wherein each of the plurality of nanoresonators comprises a spacer layer and a semiconductor compound layer provided on the spacer layer.

6. The semiconductor laser device of claim 5, wherein the semiconductor compound layer of each of the plurality of nanoresonators comprises an $A''BY$ semiconductor compound.

7. The semiconductor laser device of claim 5, wherein the spacer layer of each of the plurality of nanoresonators comprises an oxide of a Group III-V semiconductor compound.

8. The semiconductor laser device of claim 4, wherein the metasurface comprises a spacer layer provided below the plurality of nanoresonators.

9. The semiconductor laser device of claim 1, wherein the semiconductor laser light-emitting structure comprises an active area layer and a lower distributed Bragg reflector layer provided on one side of the active area layer, and
wherein the metasurface is provided on an opposite side of the lower distributed Bragg reflector layer with respect to the active area layer.

10. The semiconductor laser device of claim 9, wherein the metasurface is configured to function as an upper reflector layer pairing up with the lower distributed Bragg reflector layer.

11. The semiconductor laser device of claim 9, further comprising:
a transparent dielectric layer covering the metasurface; and
an upper distributed Bragg reflector layer provided on the transparent dielectric layer.

12. The semiconductor laser device of claim 1, further comprising a plurality of sub-semiconductor laser devices in each of which the semiconductor laser light-emitting structure and the wavelength converter are integrated,
wherein each of the plurality of sub-semiconductor laser devices is configured to emit visible light having a wavelength different from other sub-semiconductor laser devices of the plurality of sub-semiconductor laser devices.

13. A semiconductor laser device comprising:
a substrate;
a semiconductor laser light-emitting structure comprising:
a lower distributed Bragg reflector layer,
a first-type conductive semiconductor contact layer,
an active area layer, and
a second-type conductive semiconductor contact layer,
which are sequentially stacked on the substrate,
wherein the semiconductor laser light-emitting structure comprises a vertical-cavity surface-emitting laser structure configured to emit infrared light;
a metasurface comprising a plurality of nanoresonators, each of the plurality of nanoresonators having an asymmetric cross-sectional shape, the metasurface being provided on the second-type conductive semiconductor contact layer and configured to non-linearly convert the infrared light into visible light; and
an air gap between the metasurface and the semiconductor laser light-emitting structure,
wherein each of the semiconductor laser light-emitting structure and the metasurface comprises a Group III-V semiconductor compound, and wherein the metasurface is monolithically integrated with the semiconductor laser light-emitting structure.

14. The semiconductor laser device of claim 13, wherein each of the plurality of nanoresonators comprises a spacer layer and a semiconductor compound layer provided on the spacer layer.

15. The semiconductor laser device of claim 14, wherein the semiconductor compound layer of each of the plurality of nanoresonators comprises an $A^{III}B^{V}$ semiconductor compound, and wherein the spacer layer of each of the plurality of nanoresonators comprises an oxide of the Group III-V semiconductor compound.

16. The semiconductor laser device of claim 13, wherein the metasurface comprises a spacer layer provided below the plurality of nanoresonators.

17. The semiconductor laser device of claim 13, wherein the metasurface is configured to function as an upper reflector layer pairing up with the lower distributed Bragg reflector layer.

18. The semiconductor laser device of claim 13, further comprising:
a transparent dielectric layer covering the metasurface; and
an upper distributed Bragg reflector layer provided on the transparent dielectric layer.

* * * * *